(12) United States Patent
Inomata et al.

(10) Patent No.: US 6,171,750 B1
(45) Date of Patent: Jan. 9, 2001

(54) RADIATION-SENSITIVE RESIN COMPOSITION

(75) Inventors: Katsumi Inomata; Katsuji Douki; Tooru Mizumachi; Shin-ichiro Iwanaga, all of Yokkaichi (JP)

(73) Assignee: JSR Corporation, Tokyo (JP)

( * ) Notice: Under 35 U.S.C. 154(b), the term of this patent shall be extended for 0 days.

(21) Appl. No.: 09/094,469

(22) Filed: Jun. 10, 1998

(30) Foreign Application Priority Data

Jun. 11, 1997 (JP) .................................... 9-169414
Feb. 20, 1998 (JP) .................................... 10-055998

(51) Int. Cl.[7] .................................... G03F 7/023

(52) U.S. Cl. .................... 430/191; 430/165; 430/192; 430/193

(58) Field of Search .................... 430/191, 192, 430/193, 165

(56) References Cited

U.S. PATENT DOCUMENTS

| | | | |
|---|---|---|---|
| 5,403,696 | * 4/1995 | Hioki et al. | 430/192 |
| 5,674,657 | 10/1997 | Tan et al. | 430/191 |
| 5,736,292 | * 4/1998 | Ida et al. | 430/191 |
| 5,753,405 | * 5/1998 | Elsasser et al. | 430/165 |
| 5,942,369 | * 8/1999 | Ota et al. | 430/192 |
| 5,948,587 | * 9/1999 | Kawabe et al. | 430/191 |

FOREIGN PATENT DOCUMENTS 0 434 442   6/1991   (EP).
0 443 607   8/1991   (EP).

OTHER PUBLICATIONS

Derwent Abstracts, AN 94–002719, JP 5–313367, Nov. 26, 1993.
Derwent Abstracts, AN 97–116964, KR 9 505 932, Jun. 7, 1995.

* cited by examiner

Primary Examiner—John S. Chu
(74) Attorney, Agent, or Firm—Oblon, Spivak, McClelland, Maier & Neustadt, P.C.

(57) ABSTRACT

A radiation-sensitive resin composition including (A) an alkali-soluble novolak resin obtained by condensing a particular combination of a first phenol having formula:

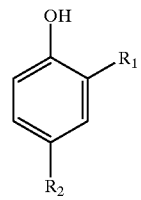

wherein $R_1$ and $R_2$ are the same or different and each represent an alkyl group, a cycloalkyl group, an alkoxyl group or an aryl group; and a second phenol selected from the group consisting of phenol, o-cresol, m-cresol, p-cresol, 2,3-dimethylphenol, 2,5-dimethylphenol, 2,6-dimethylphenol, 3,4-dimethylphenol, 3,5-dimethylphenol, 2,3,5-trimethylphenol, 3,4,5-trimethylphenol, resorcinol, 2-methylresorcinol, 4-ethylresorcinol, hydroquinone, methylhydroquinone, catechol, 4-methyl-catechol, pyrogallol, phloroglucinol, thymol and isothymol with an aldehyde in the presence of an acidic catalyst; and (B) a quinonediazidosulfonic acid ester compound. This composition exhibits good resolution, developability, heat resistance, pattern shape, exposure margin and focal latitude in a well balanced state. It also can effectively prevent occurrence of scum and also has a good sensitivity.

21 Claims, No Drawings

RADIATION-SENSITIVE RESIN COMPOSITION

BACKGROUND OF THE INVENTION

1. Field of the Invention

This invention relates to a radiation-sensitive resin composition containing an alkali-soluble resin. More particularly, this invention relates to a radiation-sensitive resin composition suited for a photoresist used for fabricating integrated circuits, that is well sensitive to a variety of radiations including ultraviolet radiations such as g-rays and i-rays, far-ultraviolet radiations such as KrF excimer laser beams, X-radiations such as synchrotron rays, and charged-particle radiations such as electron rays, and particularly sensitive to ultraviolet radiations and far-ultraviolet radiations.

2. Description of the Prior Art

Positive photoresists are widely used in the fabrication of integrated circuits. As integrated circuits have become more highly integrated in recent years, it is desired to provide positive photoresists that enables formation of photoresist patterns more improved in resolution.

To improve photoresist materials commonly for the purpose of improving the resolution of positive photoresists, a method is available in which e.g., alkali-soluble resins used in photoresists are made to have a low molecular weight. This method, however, may cause a problem that the photoresists may have a low heat resistance. Another method is also available in which, as an approach from process improvement, the numerical aperture (NA) of a stepper is made greater for improving the resolution. This method, however, may cause a problem of resulting in a narrow focal depth (focal latitude), and hence simultaneously requires an improvement of the photoresist material. For example, in order to improve the focal latitude, one of measures therefor is to add a quinonediazide compound in a larger quantity. However, the addition of the quinonediazide compound in a larger quantity results in a poor developability. Thus, in the positive photoresists, an improvement in one performance brings about a lowering of another performance. Accordingly, it is required to provide a positive photoresist simultaneously having a high resolution, a good focal latitude and a good developability in a fine pattern.

For example, Japanese Pre-examination Patent Publication (kokai) No. 8-262710 discloses a positive photoresist composition containing (A) an alkali-soluble resin obtained by subjecting at least one phenol compound represented by the following general formula (I) and at least one phenol compound other than the phenol compound of the formula (I) to condensation with an aldehyde in the presence of an acid catalyst and (B) a quinonediazidosulfonic acid ester radiation-sensitive agent.

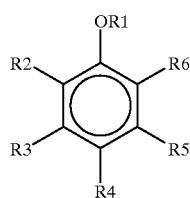

(I)

wherein $R_1$ represents a hydrogen atom, a substituted or unsubstituted alkyl group, a substituted or unsubstituted cycloalkyl group or a substituted or unsubstituted aryl group; and $R_2$ to $R_6$ each independently represent a hydrogen atom, a halogen atom, a substituted or unsubstituted alkyl group or a substituted or unsubstituted cycloalkyl group, and any one of $R_2$, $R_4$ and $R_6$ is a hydrogen atom provided that two or more of them are not hydrogen atoms at the same time. As the alkali-soluble resin, the publication specifically discloses a resin obtained by condensation of a combination of 2,6-dimethylphenol and a phenol other than the phenol compound of the general formula (I), e.g., m-cresol, with an aldehyde.

However, the positive photoresist composition disclosed therein has insufficient performances in respect of resolution, developability, heat resistance, pattern shape, exposure margin and focal latitude, and also has a problem that these performances are ill balanced.

SUMMARY OF THE INVENTION

Accordingly, an object of the present invention is to provide a radiation-sensitive resin composition that has superior performances in respect of resolution, developability, heat resistance, pattern shape, exposure margin and focal latitude, and also can exhibit these performances in a well balanced state.

According to the present invention, the above object can be achieved by a radiation-sensitive resin composition comprising:

(A) an alkali-soluble resin obtained by subjecting at least one phenol represented by the following general formula (1) (hereinafter "first phenol"):

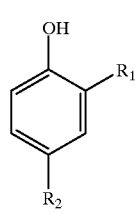

(1)

wherein $R_1$ and $R_2$ are the same or different and each represent an alkyl group, a cycloalkyl group, an alkoxyl group or an aryl group; and at least one phenol selected from the group consisting of hydroxybenzene(phenol), o-cresol, m-cresol, p-cresol, 2,3-dimethylphenol, 2,5-dimethylphenol, 2,6-dimethylphenol, 3,4-dimethylphenol, 3,5-dimethylphenol, 2,3,5-trimethylphenol, 3,4,5-trimethylphenol, resorcinol, 2-methylresorcinol, 4-ethylresorcinol, hydroquinone, methylhydroquinone, catechol, 4-methylcatechol, pyrogallol, phloroglucinol, thymol and isothymol (hereinafter "second phenol") to condensation with an aldehyde in the presence of an acidic catalyst; and (B) a quinonediazidosulfonic acid ester compound.

The radiation-sensitive resin composition of the present invention has superior performances in respect of resolution, developability, heat resistance, pattern shape, exposure margin and focal latitude, and also can exhibit these performances in a well balanced state. It also can effectively prevent occurrence of scum and also has a good sensitivity. Hence, the present composition is preferably usable as a photoresist for the fabrication of integrated circuits with a high integration.

DESCRIPTION OF THE PREFERRED EMBODIMENTS

The present invention will be described below in detail.
(A) Alkali-soluble Resin The alkali-soluble resin used as the component (A) in the present invention (hereinafter often "resin (A)") is produced by using a phenol compound comprised of a first phenol represented by the general formula (1):

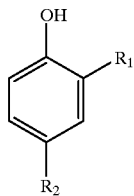
(1)

wherein $R_1$ and $R_2$ are the same or different and each represent an alkyl group, a cycloalkyl group, an alkoxyl group or an aryl group; and at least one second phenol selected from the group detailed later.

First phenol:

The first phenol represented by the general formula (1) may specifically include 2,4-dimethylphenol, 2-methyl-4-ethylphenol, 2-ethyl-4-methylphenol, 2-methyl-4-propylphenol, 2-propyl-4-methylphenol, 2-methyl-4-isopropylphenol, 2-isopropyl-4-methylphenol, 2-methyl-4-t-butylphenol, 2-t-butyl-4-methylphenol, 2,4-diethylphenol, 2,4-diisopropylphenol, 2,4-di-t-butylphenol, 2-methyl-4-cyclohexylphenol, 2-cyclohexyl-4-methylphenol, 2-methyl-4-methoxyphenol, 2-methoxyl-4-methylphenol, 2-methyl-4-t-butoxyphenol, 2-t-butoxy-4-methylphenol, 2,4-dimethoxylphenol, 2-methyl-4-phenylphenol, 2-phenyl-4-methylphenol and 2,4-diphenylphenol. Any of these may be used alone or in combination of two or more.

Of the above examples, preferred phenols are, e.g., 2,4-dimethylphenol, 2-methyl-4-ethylphenol, 2-ethyl-4-methylphenol, 2-methyl-4-propylphenol, 2-propyl-4-methylphenol, 2-methyl-4-isopropylphenol, 2-isopropyl-4-methylphenol, 2-methyl-4-t-butylphenol, 2-t-butyl-4-methylphenol and 2,4-di t-butylphenol.

Second phenol:

The second phenol is selected from the group consisting of phenol, o-cresol, m-cresol, p-cresol, 2,3-dimethylphenol, 2,5-dimethylphenol, 2,6-dimethylphenol, 3,4-dimethylphenol, 3,5-dimethylphenol, 2,3,5-trimethylphenol, 3,4,5-trimethylphenol, resorcinol, 2-methylresorcinol, 4-ethylresorcinol, hydroquinone, methylhydroquinone, catechol, 4-methyl-catechol, pyrogallol, phloroglucinol, thymol and isothymol. Of these second phenols, phenol, o-cresol, m-cresol, p-cresol, 2,3-dimethylphenol, 2,5-dimethylphenol, 3,4-dimethylphenol, 3,5-dimethylphenol and 2,3,5-trimethylphenol are preferred. Particularly preferred are m-cresol, p-cresol and 2,5-dimethylphenol.

Any of these second phenols may be used alone or in combination of two or more.

There are no particular limitations on the combination of the first phenol with the second phenol. Any phenols selected from the respective ones may be combined. Such a combination may include, e.g., 2,4-dimethylphenol/m-cresol, 2,4-dimethylphenol/m-cresol/phenol, 2,4-dimethylphenol/m-cresol/p-cresol, 2,4-dimethylphenol/m-cresol/2,3-dimethylphenol, 2,4-dimethylphenol/m-cresol/2,5-dimethylphenol, 2,4-dimethylphenol/m-cresol/3,4-dimethylphenol, 2,4-dimethylphenol/m-cresol/3,5-dimethylphenol, 2,4-dimethylphenol/m-cresol/2,3,5-trimethylphenol, 2-methyl-4-t-butylphenol/m-cresol, 2-methyl-4-t-butylphenol/m-cresol/phenol, 2-methyl-4-t-butylphenol/m-cresol/p-cresol, 2-methyl-4-t-butylphenol/m-cresol/2,3-dimethylphenol, 2-methyl-4-t-butylphenol/m-cresol/2,5-dimethylphenol, 2-methyl-4-t-butylphenol/m-cresol/2,3,5-trimethylphenol, 2-t-butyl-4-methylphenol/m-cresol, 2-t-butyl-4-methylphenol/m-cresol/phenol, 2-t-butyl-4-methylphenol/m-cresol/p-cresol, 2-t-butyl-4-methylphenol/m-cresol/2,3-dimethylphenol, 2-t-butyl-4-methylphenol/m-cresol/2,5-dimethylphenol and 2-t-butyl-4-methylphenol/m-cresol/2,3,5-trimethylphenol. In these combinations, the first phenol represented by the general formula (1) may preferably be in an amount ranging from 5% by weight to 60% by weight, and particularly preferably from 10% by weight to 40% by weight, in the total phenol compounds.

Aldehyde:

The aldehyde with which the phenol compound is subjected to condensation may include, e.g., formaldehyde, trioxane, paraformaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, furfural, glyoxal, glutaldehyde, terephthalaldehyde and isophthalaldehyde. Of these, formaldehyde and o-hydroxybenzaldehyde may particularly preferably be used.

Any of these aldehyde compounds may also be used alone or in combination of two or more. The aldehyde may preferably be used in an amount of from 0.4 to 2 mols, and more preferably form 0.6 to 1.5 mols, per mol of the phenol compound.

Condensation reaction:

In the condensation reaction of the phenol compound with the aldehyde compound, an acidic catalyst is used. The acidic catalyst may include, e.g., hydrochloric acid, nitric acid, sulfuric acid, formic acid, oxalic acid, acetic acid, methanesulfonic acid and p-toluenesulfonic acid. In particular, sulfuric acid, oxalic acid, acetic acid and p-toluenesulfonic acid are preferred. Any of these acidic catalyst may usually be used in an amount of from $1 \times 10^{-5}$ to $5 \times 10^{-1}$ mol per mol of the phenol compound.

In the condensation reaction, water is usually used as a reaction medium for the reaction. If the phenol compound used in the reaction does not dissolve in the aqueous solution of the aldehyde to make the reaction system heterogeneous from the beginning of the reaction, a hydrophilic organic solvent may preferably be used as the reaction medium. Such a hydrophilic solvent may include, e.g., alcohols such as methanol, ethanol, propanol, butanol and propylene glycol monomethyl ether; cyclic ethers such as tetrahydrofuran and dioxane; and ketones such as methyl ethyl ketone, methyl isobutyl ketone and 2-heptanone. Such a reaction medium may usually be used in an amount of from 20 to 1,000 parts by weight based on 100 parts by weight of the reactant materials.

The condensation reaction may be carried out usually at a temperature of from 10 to 200° C., which may appropriately adjusted in accordance with the reactivity of reactant materials.

The reaction may be carried out by appropriately employing a method in which the phenol compound, the aldehyde, the acidic catalyst and so forth are charged together in a reaction vessel, or a method in which the phenol compound, the aldehyde compound and so forth are added with progress of the reaction in the presence of the acidic catalyst which is charged in a reaction vessel in advance.

After the condensation reaction is completed, in order to remove the unreacted reactant materials, the acidic catalyst, the reaction medium and so forth, the reaction temperature may be raised to 130° C. to 230° C. to remove volatile components under reduced pressure, and a novolak resin can be thereby recovered.

In view of the operability required when the resulting composition is coated on a substrate and the developability, sensitivity and heat resistance required when the composition is used as a photoresist, the resin (A) may preferably have a weight-average molecular weight (Mw) of from 2,000 to 20,000, and more preferably from 3,000 to 15,000. The weight average molecular weight (Mw) herein means one in terms of polystyrene as measured by gel permeation chromatography (detector: a differential refractometer). The resin (A) having such a high weight average molecular weight Mw of 2,000 to 20,000 is especially called "resin (A1)".

The resin (A1) may preferably have a peak area rate S1 (%) of $30 \leq S1 \leq 80$ for the fraction where the Mw is 5,000 or more, a peak area rate S2 (%) of $20 \leq S2 \leq 60$ for the fraction where the Mw is from 1,000 to less than 5,000 and a peak area rate S3 (%) of $0 \leq S3 \leq 10$ for the fraction where the Mw is less than 1,000, and more preferably $35 \leq S1 \leq 75$, $25 \leq S2 \leq 55$ and $0 \leq S3 \leq 10$. To obtain such a high-molecular-weight alkali-soluble resin (A1), the resin (A) synthesized in the manner described above may be dissolved in a good solvent such as ethylene glycol monomethyl ether acetate, methyl 3-methoxypropionate, methyl isobutyl ketone, dioxane, methanol or ethyl acetate, and then a poor solvent such as n-hexane or n-heptane may be mixed in the resultant solution to cause a resin solution layer to settle. Next, the resin solution layer having settled may be separated to obtain the high-molecular-weight resin (A1).

(B) Quinonediazidosulfonic Acid Ester Compound

The quinonediazidosulfonic acid ester compound used in the present invention may include 1,2-benzoquinonediazido-4-sulfonic acid esters, 1,2-naphthoquinonediazido-4-sulfonic acid esters, 1,2-naphthoquinonediazido-5-sulfonic acid esters or 1,2-naphthoquinonediazido-6-sulfonic acid esters of polyhydroxyl compounds. These may be used singly or in combination of two or more. In particular, 1,2-naphthoquinonediazido-4-sulfonic acid esters and 1,2-naphthoquinonediazido-5-sulfonic acid esters are preferred.

The quinonediazidosulfonic acid ester compound can be obtained by, e.g., allowing a polyhydroxyl compound to react with quinonediazidosulfonyl chloride in the presence of a basic catalyst. Normally, the rate of the hydroxyl groups esterified with the quinonediazidosulfonyl chloride to the total hydroxyl groups of the polyhydroxyl compound (average esterification percentage) is from 20% to 100%, and preferably from 40% to 95%. If the average esterification percentage is too low, the pattern may be formed with difficulty, and if it is too high, a low sensitivity may result.

There are no particular limitations on the polyhydroxyl compound used here. As examples thereof, it may include the following compounds.

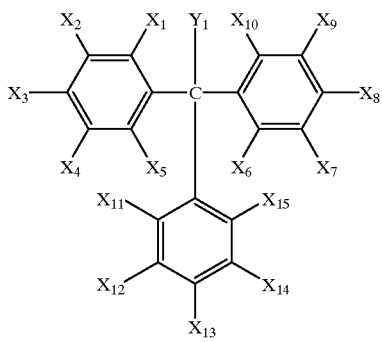

wherein $X_1$ to $X_{15}$ each independently represent a hydrogen atom, an alkyl group having 1 to 4 carbon atoms, an alkoxyl group having 1 to 4 carbon atoms, an aryl group having 6 to 10 carbon atoms or a hydroxyl group, provided that at least one member in each of groups $X_1$ to $X_5$, $X_6$ to $X_{10}$ and $X_{11}$ to $X_{15}$ is a hydroxyl group; and $Y_1$ represents a hydrogen atom or an alkyl group having 1 to 4 carbon atoms.

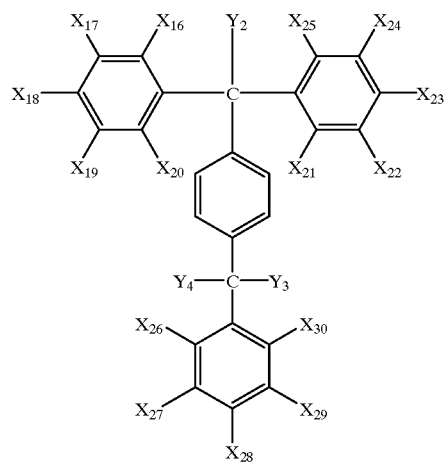

wherein $X_{16}$ to $X_{30}$ each represent the same atom or group as the above $X_1$ to $X_{15}$, provided that at least one member in each of groups $X_{16}$ to $X_{20}$, $X_{21}$ to $X_{25}$ and $X_{26}$ to $X_{30}$ is a hydroxyl group; and $Y_2$ to $Y_4$ each independently represent a hydrogen atom or an alkyl group having 1 to 4 carbon atoms.

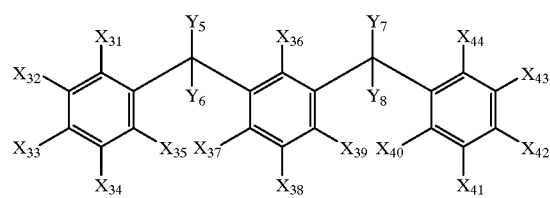

wherein $X_{31}$ to $X_{44}$ each represent the same atom or group as the above $X_1$ to $X_{15}$, provided that at least one member in $X_{31}$ to $X_{35}$ is a hydroxyl group; and $Y_5$ to $Y_8$ each independently represent a hydrogen atom or an alkyl group having 1 to 4 carbon atoms.

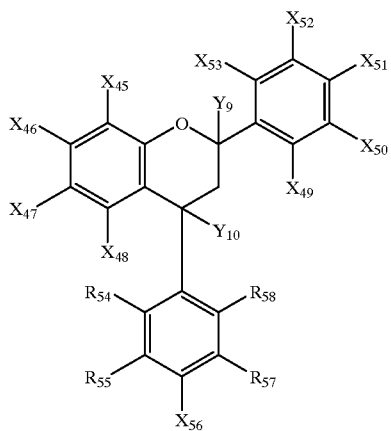

wherein $X_{45}$ to $X_{58}$ each independently represent a hydrogen atom, a halogen atom, an alkyl group having 1 to 4 carbon atoms, an alkoxyl group having 1 to 4 carbon atoms or a cycloalkyl group having 5 to 7 carbon atoms or a hydroxyl group, provided that at least one member in each of groups $X_{45}$ to $X_{48}$ and $X_{49}$ to $X_{53}$ is a hydroxyl group; and $Y_9$ and $Y_{10}$ each independently represent a hydrogen atom, an alkyl group having 1 to 4 carbon atoms or a cycloalkyl group having 5 to 7 carbon atoms.

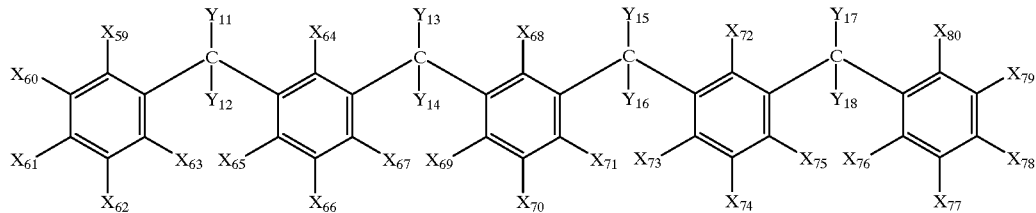

wherein $X_{59}$ to $X_{80}$ are as defined for the above $X_{45}$ to $X_{58}$, provided that at least one member in each of groups $X_{59}$ to $X_{63}$, $X_{64}$ to $X_{67}$, $X_{72}$ to $X_{75}$ and $X_{76}$ to $X_{80}$ is a hydroxyl group; and $Y_{11}$ and $Y_{18}$ each independently represent a hydrogen atom or an alkyl group having 1 to 4 carbon atoms.

Any of these quinonediazidosulfonic acid ester compounds may be used alone or in combination of two or more.

In the composition of the present invention, the component-(B) quinonediazidosulfonic acid ester compound may preferably be used in an amount of from 5 to 60 parts by weight, and particularly from 10 to 50 parts by weight, based on 100 parts by weight of the resin (A). At the same time, the 1,2-quinonediazidosulfonyl residual group contained in the component (B) may preferably be in an amount of from 5 to 50% by weight, and more preferably from 10 to 30% by weight, based on the weight of the total solid content of the composition of the present invention.

Other Components

To the composition of the present invention, various additives may be optionally added.

Dissolution accelerator:

In the present invention, for the purpose of improving the alkali-solubility of the resin (A), it is possible to add a low-molecular-weight phenol compound as a "dissolution accelerator". This low-molecular-weight phenol may preferably be a phenol compound having 2 to 5 benzene rings, which may include, e.g., compounds represented by the following formulas (2-1) to (2-9):

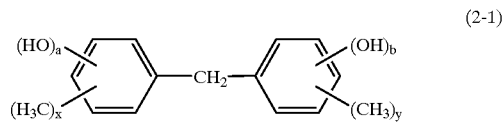

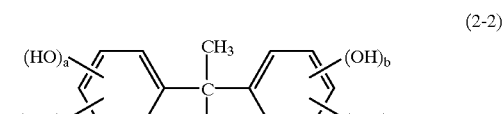

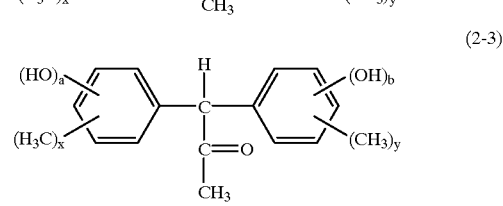

wherein in the formulas (2-1) to (2-3), a and b are each independently an integer of 0 to 3, provided that they are not 0 at the same time; x and y are each independently an integer of 0 to 3; and $a+x \leq 5$ and $b+y \leq 5$,

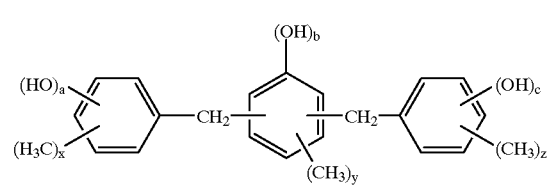

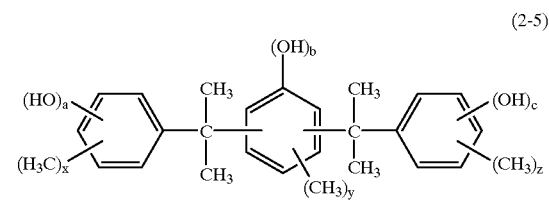

-continued

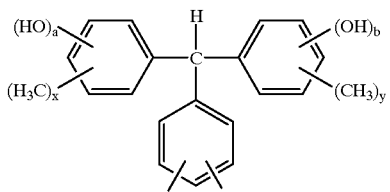
(2-6)

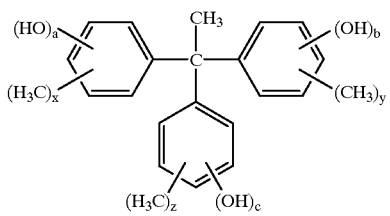
(2-7)

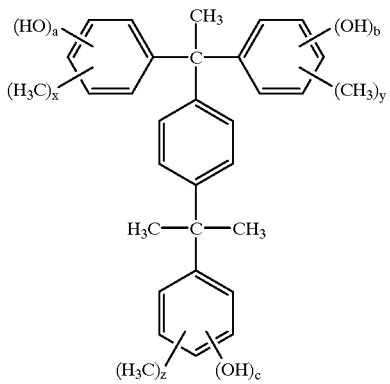
(2-8)

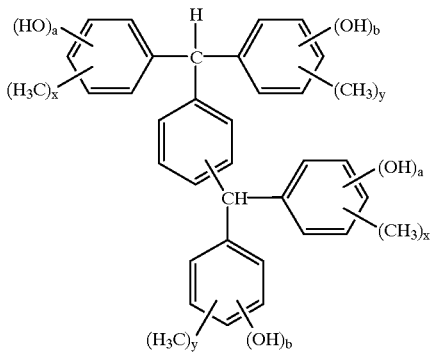
(2-9)

wherein in the formulas (2-4) to (2-9), a, b and c are each independently an integer of 0 to 3, provided that they are not 0 at the same time; x, y and z are each independently an integer of 0 to 3. In the formulas (2-4) and (2-5), b+y≦4. In the formulas (2-6) to (2-9), a+x≦5, b+y≦4 and c+z≦5.

Such a dissolution accelerator may usually be mixed in an amount of not more than 50 parts by weight, and preferably from 5 to 30 parts by weight, based on 100 parts by weight of the resin (A).

The composition of the present invention may further be mixed with a surface-active agent.

Surface-active agent:

The surface active agent is mixed in order to improve coating properties and developability of the composition. The surface active agent may include, e.g., polyoxyethylene lauryl ether, polyoxyethylene octyl phenyl ether, polyoxyethylene nonyl phenyl ether, polyoxyethylene glycol dilaurate, polyoxyethylene glycol distearate, Megafax F171, F172, F173, F471, R-07, R-08 (trade names; available from Dainippon Ink & Chemicals, Incorporated), Florado FC430, FC431 (trade names; available from Sumitomo 3M Limited), ASAHI GUARD AG710, Surflon S-382, SC-101, SC-102, SC-103, SC-104, SC-105, SC-106 (trade names; available from Asahi Glass Co., Ltd.), KP341 (trade name; available from Shin-Etsu Chemical Co., Ltd.), Polyflow No.75, No.95 (trade names; available from Kyoeisha Chemical Co., Ltd.), and NBX-7, NBX-8, NBX-15 (trade names; available from NEOS Company Limited).

Any of these surface active agents may preferably be mixed in an amount of not more than 2 parts by weight based on 100 parts by weight of the solid content of the composition.

In order to render latent images visible at the radiation-exposed areas of the photoresist and make them less affected by halation at the time of exposure to radiations, the composition of the present invention may further be mixed with a dye or pigment. In order to improve adhesion, it may also be mixed with an adhesive auxiliary. It may still also optionally be mixed with a storage stabilizer, an antifoamer and so forth.

Solvent:

The composition of the present invention is prepared by dissolving components such as the above components (A) and (B) in a solvent so as to be in a solid content concentration of from 20 to 40% by weight, followed by filtration using a filter having a pore size of about 0.2 μm.

The solvent used here may include, e.g., ethyleneglycol monomethyl ether, ethyleneglycol monoethyl ether, ethyleneglycol monomethyl ether acetate, ethyleneglycol monoethyl ether acetate, diethyleneglycol monomethyl ether, diethyleneglycol monoethyl ether, propyleneglycol monomethyl ether acetate, propyleneglycol monopropyl ether acetate, toluene, xylene, methyl ethyl ketone, 2-heptanone, 3-heptanone, 4-heptanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-ethoxypropionate, ethyl 3-methoxypropionate, ethyl acetate, butyl acetate, methyl pyruvate, and ethyl pyruvate. It is also possible to further add a high-boiling solvent such as N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and ethylene glycol monophenyl ether acetate. Any of these solvents may be used alone or in combination of two or more.

Use:

The composition of the present invention is useful as a photoresist.

To form a photoresist film by using this composition, the composition of the present invention, prepared in the form of a solution, is coated by, e.g., rotary coating, flow-coating or roll coating on substrate such as a silicon wafer or a wafer having a coating such as aluminum thereon. Subsequently, the coating thus formed is pre-baked to form a photoresist film, and the photoresist film is exposed to radiation so as to form a desired photoresist pattern, followed by development with a developing solution to form a pattern.

As the radiation used here, ultraviolet radiations such as g-rays and i-rays may preferably be used. Other various radiations may also be used, including far-ultraviolet radiations such as excimer laser beams, X-radiations such as synchrotron rays and charged-particle radiations such as electron rays.

After the formation of the photoresist film, its prebaking and exposure to radiations, the composition of the present invention may be subjected to an operation of heating at 70 to 140° C. (hereinafter "post-baking"), before development. This can make the present invention more effective.

As the developing solution applied on the photoresist film, an aqueous alkaline solution may be used which is prepared by dissolving an alkaline compound such as sodium hydroxide, potassium hydroxide, sodium carbonate, sodium silicate, sodium metasilicate, ammonia water, ethylamine, n-propylamine, diethylamine, di n-propylamine, triethylamine, methyldiethylamine, dimethylethanolamine, triethanolamine, tetramethylammonium hydroxide, tetraethylammonium hydroxide, choline, pyrrole, piperidine, 1,8-azabicyclo-[5.4.0]-7-undecene or 1,5-diazabicyclo-[4.3.0]-5-nonane, in water in a concentration of, e.g., 1 to 10% by weight.

To the developing solution, a water-soluble organic solvent, e.g., an alcohol such as methanol and ethanol and a surface-active agent may be added in appropriate quantities.

When the developing solution comprised of such an aqueous alkaline solution is used, the surface is normally washed with water after the development.

Particularly preferred embodiments of the present invention are as follows:

1. An embodiment in which the first phenol represented by the general formula (1) used in the synthesis of the component-(A) resin is a phenol selected from the group consisting of 2,4-dimethylphenol, 2-methyl-4-t-butylphenol, 2-t-butyl-4 -methylphenol and 2,4-di t-butylphenol.
2. An embodiment in which the component-(A) resin has an Mw of $3,000 \leq Mw \leq 15,000$, and has a peak area rate S1 (%) of $30 \leq S1 \leq 80$ for its fraction where the molecular weight in terms of polystyrene is 5,000 or more, a peak area rate S2 (%) of $20 \leq S2 \leq 60$ for its fraction where the molecular weight in terms of polystyrene is from 1,000 to less than 5,000 and a peak area rate S3 (%) of $0 \leq S3 \leq 10$ for its fraction where the molecular weight in terms of polystyrene is less than 1,000.
3. The phenol compound used in the synthesis of the resin (A) contains the first phenol represented by the general formula (1) in an amount of 5% by weight or higher but less than 60% by weight.

EXAMPLES

The present invention will be described below in greater detail by giving Examples. The present invention is by no means limited by these Examples. In the following, Synthesis Examples and so forth marked with "*" are concerned with constituent factors or compositions which do not fulfill the requirements of the present invention.

Synthesis of Resin (A)

In the following Synthesis Examples, the Mw of the resins obtained was measured by gel permeation chromatography (GPC) (detector: a differential refractometer RI), using monodisperse polystyrene as the standard, with GPC columns G2000HXL (two columns), G3000HXL (one column) and G4000HXL (one column), available from Toso Co., Ltd., under analysis conditions of a flow rate of 1.0 ml/minute, tetrahydrofuranan for elution solvent and a column temperature of 40° C.

With regard to the S1, S2 and S3, the retention times corresponding to Mw 1,000 and Mw 5,000, respectively, were determined on the basis of a calibration curve prepared using monodisperse polystyrene, and the peak area of the fraction of Mw of 5,000 or more, the peak area of the fraction of Mw of from 1,000 to less than 5,000 and the peak area of the fraction of Mw of less than 1,000 were measured to determine the respective area rates.

Synthesis Example 1

Into a 2-litter separable flask provided with a condenser tube and a stirrer, 48.8 g (0.4 mol) of 2,4-dimethylphenol, 172.8 g (1.6 mols) of m-cresol, 121.6 g of an aqueous 37% by weight formaldehyde solution (formaldehyde: 1.5 mols), 12.6 g (0.1 mol) of oxalic acid dihydrate and 554 g of methyl isobutyl ketone were charged to carry out condensation for 8 hours with stirring while keeping the internal temperature at 90 to 100° C. The resin solution thus formed was washed twice with 500 g of ion-exchanged water to obtain a novolak resin (A-1). This resin (A-1) had an Mw of 4,600.

Synthesis Example 2

Into a 2-litter separable flask provided with a condenser tube and a stirrer, 48.8 g (0.4 mol) of 2,4-dimethylphenol, 151.2 g (1.4 mols) of m-cresol, 21.6 g (0.2 mol) of p-cresol, 120.0 g of an aqueous 37% by weight formaldehyde solution (formaldehyde: 1.4 mols), 12.6 g (0.1 mol) of oxalic acid dihydrate and 554 g of methyl isobutyl ketone were charged to carry out condensation in the same manner as in Synthesis Example 1 to obtain a novolak resin. This resin was designated as resin (A-2). The resin (A-2) had an Mw of 5,100.

Synthesis Examples 3 to 6

The procedure of Synthesis Example 1 was repeated except that the phenols and catalyst were replaced with those shown in Table 1. Thus, novolak resins (A-3) to (A-6) were obtained.

Synthesis Examples 7* to 9*

In Synthesis Examples 7*, 8* and 9*, novolak resins (A-7*) to (A-9*) were obtained in the same manner as in Synthesis Examples 1, 2 and 4, respectively, except that the 2,4-di-substituted phenols were each replaced with 2,6-dimethyphenol.

TABLE 1

| Synthesis Example | Resin | Phenol compounds | Formaldehyde (mol) | Catalyst (mol) | Weight-average molecular weight (Mw) |
|---|---|---|---|---|---|
| 1 | A-1 | 2,4-dimethylphenol (0.4 mol) m-cresol (1.6 mols) | 1.5 | oxalic acid (0.1) | 4,600 |
| 2 | A-2 | 2,4-dimethylphenol (0.4 mol) m-cresol (1.4 mols) p-cresol (0.2 mols) | 1.4 | oxalic acid (0.1) | 5,100 |
| 3 | A-3 | 2,4-dimethylphenol (0.6 mol) m-cresol (1.4 mols) | 1.4 | p-toluene-sulfonic acid (0.09) | 4,800 |
| 4 | A-4 | 2-t-butyl-4-methylphenol (0.4 mol) m-cresol (1.6 mols) | 1.5 | p-toluene-sulfonic acid (0.09) | 4,800 |
| 5 | A-5 | 2,4-dimethylphenol (0.4 mol) m-cresol (1.2 mols) 2,5-dimethylphenol | 1.3 | methane-sulfonic acid (0.09) | 5,000 |

TABLE 1-continued

| Synthesis Example | Resin | Phenol compounds | Form- alde- hyde (mol) | Catalyst (mol) | Weight- average molecular weight (Mw) |
|---|---|---|---|---|---|
| 6 | A-6 | (0.4 mol) 2-t-butyl-4-methylphenol (0.4 mol) m-cresol (1.4 mols) p-cresol (0.2 mol) | 1.4 | methane-sulfonic acid (0.09) | 5,300 |
| 7* | A-7* | 2,6-dimethylphenol (0.4 mol) m-cresol (1.6 mols) | 1.5 | oxalic acid (0.1) | 4,800 |
| 8* | A-8* | 2,6-dimethylphenol (0.4 mol) m-cresol (1.4 mols) p-cresol (0.2 mol) | 1.4 | oxalic acid (0.1) | 5,200 |
| 9* | A-9* | 2,6-dimethylphenol (0.4 mol) m-cresol (1.6 mols) | 1.5 | p-toluene-sulfonic acid (0.09) | 5,100 |

Synthesis Example 10

To 500 g of the novolak resin solution obtained in Synthesis Example 1, 600 g of n-hexane was added, and the resultant mixture was stirred for 30 minutes and then allowed to stand for 1 hour. The supernatant on the resin layer which settled was removed by decantation, followed by addition of ethyl 2-hydroxpropionate. The residual methyl isobutyl ketone and n-hexane were distilled off under reduced pressure with heating to obtain an ethyl 2-hydroxypropionate solution of resin (a-1). This novolak resin had an Mw of 6,400. S1, S2 and S3 were also measured to obtain the results as shown in Table 2.

Synthesis Examples 11 to 18*

The procedure of Synthesis Example 10 was repeated except that the novolak resin solution was replaced with solutions of novolak resins (A-2) to (A-6) and those of (A-7*) to (A-9*), respectively. Thus, novolak resins (a-2) to (a-6) and (a-7*) to (a-9*) were obtained. Their Mw and S1, S2 and S3 were as shown in Table 2

TABLE 2

| Synthesis Example | Resin before fraction- ation | Resin after fraction- ation | Weight-average molecular weight Mw | S1 | S2 | S3 |
|---|---|---|---|---|---|---|
| 10 | A-1 | a-1 | 6,400 | 41 | 52 | 7 |
| 11 | A-2 | a-2 | 7,100 | 49 | 45 | 6 |
| 12 | A-3 | a-3 | 6,800 | 47 | 49 | 4 |
| 13 | A-4 | a-4 | 6,700 | 47 | 48 | 5 |
| 14 | A-5 | a-5 | 7,200 | 50 | 46 | 4 |
| 15 | A-6 | a-6 | 7,300 | 55 | 39 | 6 |
| 16* | A-7* | a-7* | 6,700 | 47 | 49 | 4 |
| 17* | A-8* | a-8* | 7,100 | 50 | 44 | 6 |
| 18* | A-9* | a-9* | 7,000 | 49 | 43 | 8 |

Synthesis Example 19

Into a 2-litter separable flask provided with a condenser tube and a stirrer, 48.8 g (0.4 mol) of 2,4-dimethylphenol, 172.8 g (1.6 mols) of m-cresol, 129.8 g of an aqueous 37% by weight formaldehyde solution (formaldehyde: 1.6 mols), 12.6 g (0.1 mol) of oxalic acid dehydrate and 554 g of methyl isobutyl ketone were charged to carry out condensation for 8 hours with stirring while keeping the internal temperature at 90 to 100° C. The novolak resin solution thus formed was washed twice with 500 g of deionized water. Thereafter, to this novolak resin solution, 600 g of n-hexane was added, and the resultant mixture was stirred for 30 minutes and then allowed to stand for 1 hour. The supernatant on the resin layer having settled was removed by decantation, followed by addition of ethyl 2-hydroxypropionate. The residual methyl isobutyl ketone and n-hexane were distilled off under reduced pressure with heating to obtain an ethyl 2-hydroxypropionate solution of a novolak resin having been fractionated (called "resin (a-10)"). This novolak resin (a-10) had an Mw of 8,300.

Synthesis Example 20

Into a 2-litter autoclave, 61.1 g (0.5 mol) of 2,4-dimethylphenol, 162.1 g (1.5 mols) of m-cresol, 129.8 g of an aqueous 37% by weight formaldehyde solution (formaldehyde: 1.6 mols), 17.1 g (0.09 mol) of p-toluenesulfonic acid and 554 g of propylene glycol monomethyl ether were charged to carry out condensation for 8 hours with stirring while keeping the internal temperature at 130° C. To the resultant reaction solution containing a novolak resin, 320 g of ethyl acetate was added, and the ethyl acetate solution formed was washed with water until the solution being washed turned neutral. Thereafter, to this ethyl acetate solution, methanol and water were added in an amount of 1.2 times and an amount of 1.0 time, respectively, the weight of the solution, and the resultant mixture was stirred for 30 minutes and then allowed to stand for 1 hour. The supernatant on the resin layer having settled was removed by decantation, followed by addition of ethyl 2-hydroxypropionate. The residual ethyl acetate, methanol, water and propylene glycol monomethyl ether were distilled off under reduced pressure with heating to obtain an ethyl 2-hydroxypropionate solution of a novolak resin having been fractionated (called "resin (a-11)"). This novolak resin (a-11) had an Mw of 8,700.

Synthesis Examples 21 and 22

The procedure of Synthesis Example 19 was repeated except that the phenols, catalyst and aldehyde were replaced with those shown in Table 3. Thus, fractionated novolak resins (a-12) and (a-13) were obtained.

Synthesis Examples 23 and 24

The procedure of Synthesis Example 22 was repeated except that the phenols, catalyst and aldehyde were replaced with those shown in Table 3. Thus, fractionated novolak resins (a-14) and (a-15) were obtained.

Synthesis Example 25*

In Synthesis Example 25*, a novolak resin (A-16*) was obtained in the same manner as in Synthesis Example 20 except that the 2,4-di-substituted phenol was replaced with 2,6-dimethyphenol.

TABLE 3

| Synthesis Example | Resin | Phenol compounds (mol) | Formaldehyde (mol) | Catalyst (mol) | Weight-average molecular weight (Mw) | S1 % | S2 % | S3 % |
|---|---|---|---|---|---|---|---|---|
| 19 | a-10 | 2,4-dimethyl-phenol (0.4) m-cresol (1.6) | 1.6 | oxalic acid (0.1) | 8,300 | 58 | 26 | 6 |
| 20 | a-11 | 2,4-dimethyl-phenol (0.5) m-cresol (1.5) | 1.6 | p-toluene-sulfonic acid (0.09) | 8,100 | 54 | 42 | 4 |
| 21 | a-12 | 2,4-dimethyl-phenol (0.6) m-cresol (1.6) | 1.5 | p-toluene-sulfonic acid (0.09) | 7,400 | 48 | 45 | 7 |
| 22 | a-13 | 2-t-butyl-4-methylphenol (0.4) m-cresol (1.6) | 1.5 | oxalic acid (0.1) | 6,900 | 51 | 43 | 6 |
| 23 | a-14 | 2,4-dimethyl-phenol (0.4) m-cresol (1.2) 2,5-dimethyl-phenol (0.4) | 1.5 | p-toluene-sulfonic acid | 8,000 | 54 | 43 | 3 |
| 24 | a-15 | 2,4-dimethyl-phenol (0.4) m-cresol (1.4) p-cresol (0.2) | 1.6 | p-toluene-sulfonic acid (0.09) | 9,400 | 64 | 31 | 5 |
| 25 | a-16* | 2,6-dimethyl-phenol (0.4) m-cresol (1.6) | 1.6 | oxalic acid (0.1) | 8,400 | 52 | 42 | 6 |

Synthesis of Quinonediazidosulfonic Acid Ester Compound

Synthesis Example 26

In a light-screened environment and in an flask having a stirrer, a dropping funnel and a thermometer, 29.2 g (0.1 mol) of the compound represented by the following formula (3), 67.1 g (0.25 mol) of 1,2-naphthoquinonediazido-5-sulfonic acid chloride and 481 g of dioxane were charged, and were dissolved with stirring. Subsequently, this flask was immersed in a water bath controlled to 30° C. At the time the internal temperature became constant at 30° C., 28.3 g (0.28 mol) of triethylamine was added to this solution by the use of the dropping funnel while controlling the internal temperature not to become higher than 35° C., and the reaction was carried out for 2 hours at that temperature. Thereafter, the triethylamine hydrochloride having precipitated was removed by filtration, and the filtrate was poured into a large quantity of an aqueous dilute hydrochloric acid solution to cause the reaction product to precipitate. The precipitate formed was filtered and collected, followed by drying at 40° C. for 24 hours in a vacuum dryer to obtain a quinonediazide compound (b-1).

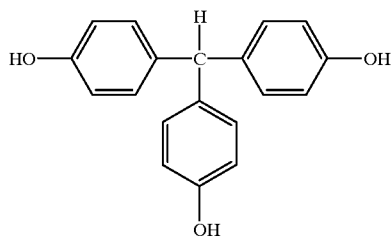

(3)

Synthesis Example 27

The procedure of Synthesis Example 26 was repeated except that 42.4 g (0.1 mol) of the compound represented by the following formula (4), 67.1 g (0.25 mol) of 1,2-naphthoquinonediazido-5-sulfonic acid chloride and 547 g of dioxane were charged. Thus, a quinonediazide compound (b-2) was obtained.

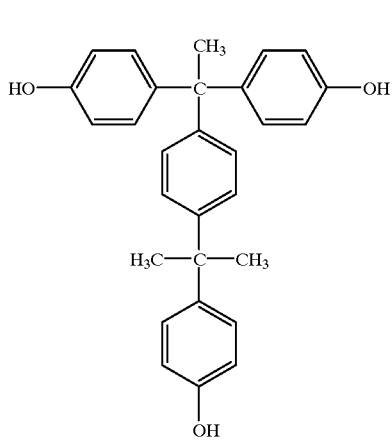

(4)

Synthesis Example 28

The procedure of Synthesis Example 26 was repeated except that 37.8 g (0.1 mol) of the compound represented by the following formula (5), 40.2 g (0.15 mol) of 1,2-naphthoquinonediazido-5-sulfonic acid chloride, 300 g of dioxane and 90 g of N,N-dimethylformamide were charged. Thus, a quinonediazide compound (b-3) was obtained.

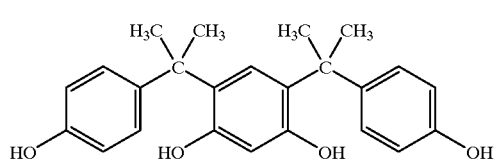

(5)

Synthesis Example 29

The procedure of Synthesis Example 26 was repeated except that 36.4 g (0.1 mol) of the compound represented by the following formula (6), 80.5 g (0.3 mol) of 1,2-naphthoquinonediazido-5-sulfonic acid chloride and 585 g of dioxane were charged. Thus, a quinonediazide compound (b-4) was obtained.

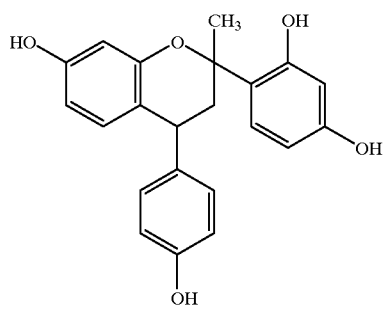

(6)

Synthesis Example 30

The procedure of Synthesis Example 26 was repeated except that 64.6 g (0.1 mol) of the compound represented by the following formula (7), 40.2 g (0.15 mol) of 1,2-naphthoquinonediazido-5-sulfonic acid chloride, 390 g of dioxane and 130 g of N,N-dimethylformamide were charged. Thus, a quinonediazide compound (b-5) was obtained.

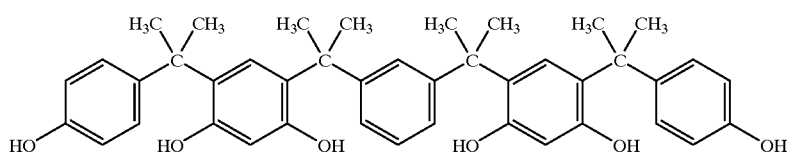

(7)

Examples 1 to 10

In each of the Examples, under formulation as shown in Table 4 ("parts" is "parts by weight"), a resin (A), a dissolution accelerator, a quinonediazide compound and a solvent were mixed to form a uniform solution, followed by filtration using a membrane filter with a pore size of 0.2 μm to prepare a solution of the composition.

The solutions thus obtained were each coated on a silicon wafer having a silicon oxide film, by means of a spin coater, followed by prebaking on a hot plate at 90° C. for 2 minutes to form a photoresist film 1.1 μm thick. Next, through a reticle, the photoresist film was exposed to light of 365 nm in wavelength (i-rays) by means of a reduction projection aligner (numerical lens aperture: 0.57) NSR-2005i9C, manufactured by Nikon K.K., and then developed using an aqueous 2.38% by weight tetramethylammonium hydroxide solution, followed by rinsing with ultra-pure water and then drying to form photoresist patterns. The photoresist patterns formed were examined, and characteristics as the photoresist patterns of the compositions in the respective Examples were evaluated by the methods described below.

Results obtained are shown in Table 5.

Resolution:

The minimum size in which 0.4 μm line-and-space patterns were resolved in a state free of pattern film loss, in the amount of exposure at which the line-and-space patterns were resolved in a ratio of 1:1 (the amount of correct exposure), was measured with a scanning electron microscope.

Developability:

Photoresist films of the compositions were formed and then patterns were formed. Thereafter, the occurrence of scum or undeveloped residue was examined using a scanning electron microscope.

Focal latitude:

Using a scanning electron microscope, focal latitude was evaluated by measuring as focal range the shift width of focus observed when the size of patterns resolved is within plus-minus 10% of the designed size of a mask in the amount of correct exposure. An instance where the focal range is great means that the photoresist has a good focal allowance.

Exposure margin:

The value given by dividing the amount of correct exposure (Eop) by the amount of exposure (Ec) at which the 0.4 μm line-and-space patterns begin to be resolved is regarded as exposure margin. An instance where the value is great means that the photoresist has a good exposure margin.

Comparative Examples 1 to 3

In Comparative Examples 1 to 3, composition solutions were prepared in the same manner as in Examples 1 to 3, respectively, except that the resin (A) was replaced with resins (a-7*), (a-8*) or (a-9*). Photoresist patterns were formed on silicon wafers similarly, and the characteristics of the photoresist patterns were examined in the same manner as in Examples.

Results Obtained are Shown in Table 5.

TABLE 4

| | Resin (A) (parts) | Dissolution accelerator (parts) | Quinonediazide compound (parts) | Solvent (parts) |
|---|---|---|---|---|
| Example:1 | a-1 (75) | α(25) | b-2/b-3 (20/15) | S1/S2 (240/100) |
| Example:2 | a-2 (75) | α(25) | b-1/b-3 (20/15) | S1/S2 (240/100) |
| Example:3 | a-3 (75) | α(25) | b-1/b-5 (15/15) | S1/S2 (240/100) |
| Example:4 | a-4 (75) | α(25) | b-2/b-3 (20/15) | S1/S2 (240/100) |
| Example:5 | a-5 (75) | α(25) | b-3/b-4 (15/18) | S1/S2 (240/100) |
| Example:6 | a-6 (75) | α(25) | b-1/b-3 (20/15) | S1/S2 (240/100) |
| Example:7 | a-1 (75) | β(25) | b-4/b-5 (15/25) | S1/S2 (240/100) |
| Example:8 | a-3 (75) | α(25) | b-4/b-5 (15/20) | S3 (300) |
| Example:9 | a-4 (75) | β(25) | b-1/b-5 (15/20) | S1/S2 (240/100) |
| Example:10 | a-6 (75) | β(25) | b-2/b-5 (10/20) | S3 (300) |
| Comparative Example:1 | a-7* (75) | α(25) | b-2/b-3 (20/15) | S1/S2 (240/100) |
| Comparative Example:2 | a-8* (75) | α(25) | b-1/b-3 (20/15) | S1/S2 (240/100) |
| Comparative Example:3 | a-9* (75) | α(25) | b-1/b-5 (15/15) | S1/S2 (240/100) |

In Table 4, the types of the dissolution accelerators and solvents are as follows:

Dissolution accelerator:

α: 1,1-bis(2,5-dimethyl-4-hydroxyphenyl)acetone

β: 4,6-bis[1-(4-hydroxyphenyl)-1-methylethyl]-1,3-dihydroxybenzene

Solvents:

S1: ethyl 2-hydroxypropionate

S2: ethyl 3-ethoxypropionate

S3: methyl-n-amylketone

TABLE 5

|  | Resolution (μm) | Focal latitude (μm) | Exposure margin (Eop/Ec) | Developability |
|---|---|---|---|---|
| Example:1 | 0.32 | 1.6 | 1.45 | Good |
| Example:2 | 0.32 | 1.4 | 1.42 | Good |
| Example:3 | 0.30 | 1.6 | 1.48 | Good |
| Example:4 | 0.32 | 1.4 | 1.42 | Good |
| Example:5 | 0.32 | 1.4 | 1.50 | Good |
| Example:6 | 0.32 | 1.4 | 1.43 | Good |
| Example:7 | 0.30 | 1.6 | 1.45 | Good |
| Example:8 | 0.30 | 1.4 | 1.45 | Good |
| Example:9 | 0.32 | 1.6 | 1.47 | Good |
| Example:10 | 0.32 | 1.4 | 1.42 | Good |
| Comparative Example:1 | 0.38 | 1.0 | 1.15 | Scummed |
| Comparative Example:2 | 0.36 | 1.0 | 1.18 | Scummed |
| Comparative Example:3 | 0.38 | 1.0 | 1.21 | Scummed |

Examples 11 to 20

Under formulation as shown in Table 6 ("parts" is "parts by weight"), the resin (A), the dissolution accelerator, the quinonediazide compound and the solvent were mixed to form uniform solutions, followed by filtration using a membrane filter with a pore size of 0.2 μm to prepare solutions of the compositions.

The solutions thus obtained were each coated on a silicon wafer having a silicon oxide film, by means of a spin coater, followed by prebaking on a hot plate at 90° C. for 2 minutes to form a photoresist film of 1.1 μm thick. Next, through a reticle, the photoresist film was exposed to light of 365 nm in wavelength (i-rays) by means of a reduction projection aligner (numerical lens aperture:0.57) NSR-2005i9C, manufactured by Nikon K.K., and then developed using an aqueous 2.38% by weight tetramethylammonium hydroxide solution, followed by rinsing with ultra-pure water and then drying to form photoresist patterns. The photoresist patterns formed were examined, and characteristics as the photoresist patterns of the compositions in the respective Examples were evaluated in the same manner as in Examples 1 to 10.

Results obtained are shown in Table 7.

With regard to heat resistance, it was evaluated in the following way:

Evaluation of heat resistance:

Wafers on which photoresist patterns had been formed were heated in an oven for 2 minutes, and the temperature at which 2.0 μm line-and-space patterns began to undergo thermal deformation was measured.

Comparative Example 4*

In Comparative Example 4*, a composition solution was prepared in the same manner as in Examples 11 to 20 except that the resin (A) was replaced with a resin (a-16*). Photoresist patterns were formed on silicon wafers similarly, and the characteristics of the photoresist patterns were examined in the same manner as in Examples 11 to 20.

Results obtained are shown in Table 7.

TABLE 6

|  | Resin (A) (parts) | Dissolution accelerator (parts) | Quinonediazide compound (parts) | Solvent (parts) |
|---|---|---|---|---|
| Example:11 | a-10 (75) | α(25) | b-2/b-3 (20/15) | S1/S2 (240/100) |
| Example:12 | a-11 (75) | α(25) | b-1/b-3 (20/15) | S1/S2 (240/100) |
| Example:13 | a-12 (75) | α(25) | b-1/b-5 (15/15) | S1/S2 (240/100) |
| Example:14 | a-13 (75) | α(25) | b-2/b-3 (20/15) | S1/S2 (240/100) |
| Example:15 | a-14 (75) | α(25) | b-3/b-4 (15/18) | S1/S2 (240/100) |
| Example:16 | a-15 (75) | α(25) | b-1/b-3 (20/15) | S1/S2 (240/100) |
| Example:17 | a-10 (75) | β(25) | b-4/b-5 (15/25) | S1/S2 (240/100) |
| Example:18 | a-12 (75) | α(25) | b-4/b-5 (15/20) | S3 (300) |
| Example:19 | a-13 (75) | β(25) | b-1/b-5 (15/20) | S1/S2 (240/100) |
| Example:20 | a-15 (75) | β(25) | b-2/b-5 (10/20) | S3 (300) |
| Comparative Example:4 | a-16* (75) | α(25) | b-2/b-3 (20/15) | S1/S2 (240/100) |

Remarks: Dissolution accelerators and solvents are as explained in regard to Table 4.

TABLE 7

|  | Resolution (μm) | Focal latitude (μm) | Exposure margin (Eop/Ec) | Developability | Heat resistance (° C.) |
|---|---|---|---|---|---|
| Example:11 | 0.30 | 1.6 | 1.45 | Good | 145 |
| Example:12 | 0.30 | 1.6 | 1.54 | Good | 140 |
| Example:13 | 0.30 | 1.8 | 1.48 | Good | 140 |
| Example:14 | 0.32 | 1.4 | 1.52 | Good | 140 |
| Example:15 | 0.30 | 1.6 | 1.52 | Good | 145 |
| Example:16 | 0.30 | 1.4 | 1.48 | Good | 145 |
| Example:17 | 0.30 | 1.6 | 1.45 | Good | 145 |
| Example:18 | 0.30 | 1.4 | 1.45 | Good | 140 |
| Example:19 | 0.32 | 1.6 | 1.47 | Good | 140 |
| Example:20 | 0.30 | 1.4 | 1.48 | Good | 140 |
| Comparative Example:4 | 0.38 | 1.0 | 1.15 | Scummed | 135 |

What is claimed is:

1. A radiation-sensitive resin composition comprising:
    (A) an alkali-soluble novolak resin obtained by subjecting a combination of a first phenol selected from the group consisting of 2,4-dimethylphenol, 2-methyl-4-ethylphenol, 2-ethyl-4-methylphenol, 2-methyl-4-propylphenol, 2-propyl-4-methylphenol, 2-methyl-4-isopropylphenol and 2-isopropyl-4-methylphenol; and a second phenol selected from the group consisting of phenol, o-cresol, m-cresol, p-cresol, 2,3-dimethylphenol, 2,5-dimethylphenol, 2,6-dimethylphenol, 3,4-dimethylphenol, 3,5-dimethylphenol, 2,3,5-trimethylphenol, 3,4,5-trimethylphenol, resorcinol, 2-methylresorcinol, 4-ethylresorcinol, hydroquinone, methylhydroquinone, catechol, 4-methyl-catechol, pyrogallol, phloroglucinol, thymol and isothymol to condensation with an aldehyde in the presence of an acidic catalyst; and
    (B) a quinonediazidosulfonic acid ester of a polyhydroxy compound, wherein the polyhydroxy compound is at least one member selected from the group consisting of the following compounds represented by the formulas (P-1) to (P-5):

(P-1)

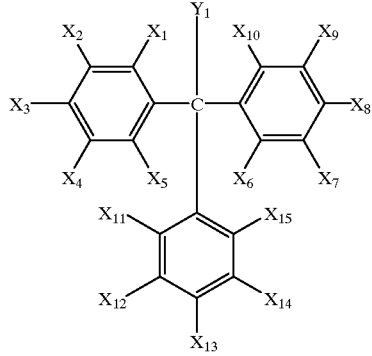

wherein $X_1$ to $X_{15}$ each independently represent a hydrogen atom, an alkyl group having 1 to 4 carbon atoms, an alkoxyl group having 1 to 4 carbon atoms, an aryl group having 6 to 10 carbon atoms or a hydroxyl group, provided that at least one member in each of groups $X_1$ to $X_5$, $X_6$ to $X_{10}$ and $X_{11}$ to $X_{15}$ is a hydroxyl group; and $Y_1$ represents a hydrogen atom or an alkyl group having 1 to 4 carbon atoms, (P-2)

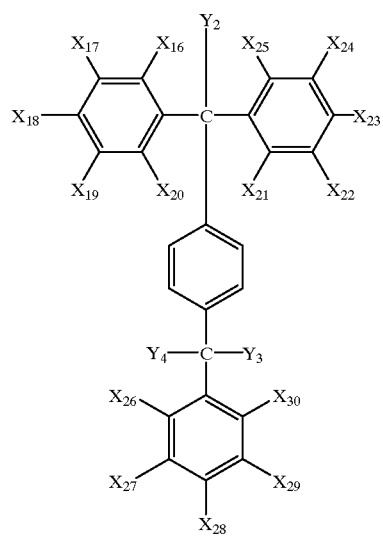

wherein $X_{16}$ to $X_{30}$ each represent the same atom or group as the above $X_1$ to $X_{15}$, provided that at least one member in each of groups $X_{16}$ to $X_{20}$, $X_{21}$ to $X_{25}$ and $X_{26}$ to $X_{30}$ is a hydroxyl group; and $Y_2$ to $Y_4$ each independently represent a hydrogen atom or an alkyl group having 1 to 4 carbon atoms, (P-3)

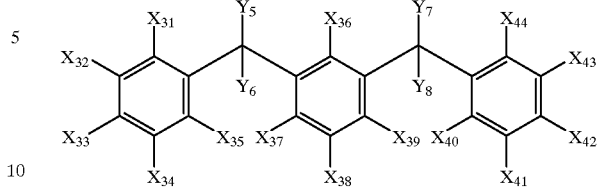

wherein $X_{31}$ to $X_{44}$ each represent the same atom or group as the above $X_1$ to $X_{15}$, provided that at least one member in $X_{31}$ to $X_{35}$ is a hydroxyl group; and $Y_5$ to $Y_8$ each independently represent a hydrogen atom or an alkyl group having 1 to 4 carbon atoms, (P-4)

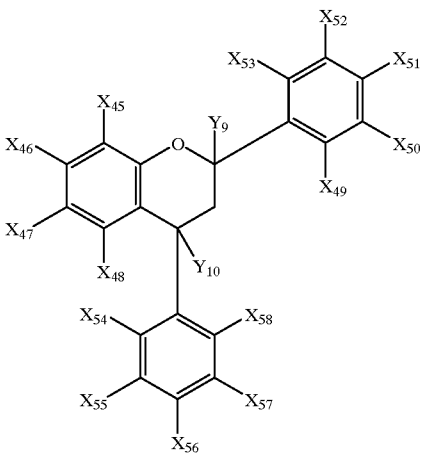

wherein $X_{45}$ to $X_{58}$ each independently represent a hydrogen atom, a halogen atom, an alkyl group having 1 to 4 carbon atoms, an alkoxyl group having 1 to 4 carbon atoms or a cycloalkyl group having 5 to 7 carbon atoms or a hydroxyl group, provided that at least one member in each of groups $X_{45}$ to $X_{48}$ and $X_{49}$ to $X_{53}$ is a hydroxyl group; and $Y_2$ and $Y_{10}$ each independently represent a hydrogen atom, an alkyl group having 1 to 4 carbon atoms or a cycloalkyl group having 5 to 7 carbon atoms, and (P-5)

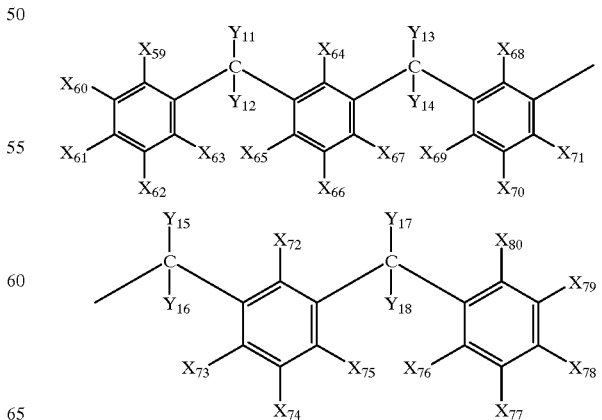

wherein $X_{59}$ to $X_{80}$ are as defined for the above $X_{45}$ to $X_{58}$, provided that at least one member in each of groups $X_{59}$ to $X_{63}$, $X_{64}$ to $X_{67}$, $X_{72}$ to $X_{75}$ and $X_{76}$ to $X_{80}$ is a hydroxyl group; and $Y_{11}$ and $Y_{18}$ each independently represent a hydrogen atom or an alkyl group having 1 to 4 carbon atoms.

2. The resin composition according to claim 1, wherein said first phenol is 2,4-dimethylphenol.

3. The resin composition according to claim 1, wherein said second phenol is selected from the group consisting of phenol, o-cresol, m-cresol, p-cresol, 2,3-dimethylphenol, 2,5-dimethylphenol, 3,4-dimethylphenol, 3,5-dimethylphenol and 2,3,5-trimethylphenol.

4. The resin composition according to claim 1, wherein said second phenol is selected from the group consisting of m-cresol, p-cresol and 2,5-dimethylphenol.

5. The resin composition according to claim 1, wherein said combination of the first and second phenols is 2,4-dimethylphenol/m-cresol, 2,4-dimethylphenol/m-cresol/phenol, 2,4-dimethylphenol/m-cresol/p-cresol, 2,4-dimethylphenol/m-cresol 2,3-dimethylphenol, 2,4-dimethylphenol/m-cresol/2,5-dimethylphenol, 2,4-dimethylphenol/m-cresol/3,4-dimethylphenol, 2,4-dimethylphenol/m-cresol/3,5-dimethylphenol, or 2,4-dimethylphenol/m-cresol/2,3,5-trimethylphenol.

6. The resin composition according to claim 1, wherein said first phenol is in an amount ranging from 5% by weight to 60% by weight in the total of said first and second phenols.

7. The resin composition according to claim 6, wherein said first phenol is in an amount ranging from 10% by weight to 40% by weight in the total of said first and second phenols.

8. The resin composition according to claim 1, wherein said aldehyde is selected form the group consisting of formaldehyde, trioxane, paraformaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, furfural, glyoxal, glutaldehyde, terephthalaldehyde and isophthalaldehyde.

9. The resin composition according to claim 8, wherein said aldehyde is selected from the group consisting of formaldehyde and o-hydroxybenzaldehyde.

10. The resin composition according to claim 1, wherein said aldehyde is in an amount of from 0.4 to 2 mols, per mol of the total phenol compounds.

11. The resin composition according to claim 1, wherein said resin of the component (A) has a weight-average molecular weight (Mw) in terms of polystyrene of from 2,000 to 20,000.

12. The resin composition according to claim 11, wherein the resin of the component (A) has a peak area rate S1 (%) of $30 \leq S1 \leq 80$ for the fraction where the Mw is 5,000 or more, a peak area rate S2 (%) of $20 \leq S2 \leq 60$ for the fraction where the Mw is at least 1,000 but less than 5,000 and a peak area rate S3 (%) of $0 \leq S3 \leq 10$ for the fraction where the Mw is less than 1,000.

13. The resin composition according to claim 12, wherein $35 \leq S1 \leq 75$, $25 \leq S2 \leq 55$ and $0 \leq S3 \leq 10$.

14. The resin composition according to claim 1, wherein said quinonediazidosulfonic acid ester compound of the component (B) is a member selected from the group consisting of 1,2-benzoquinonediazido-4-sulfonic acid esters, 1,2-naphthoquinonediazido-4-sulfonic acid esters, 1,2-naphthoquinonediazido-5-sulfonic acid esters and 1,2-naphthoquinonediazido-6-sulfonic acid esters of the polyhydroxyl compounds.

15. The resin composition according to claim 14, wherein said quinonediazidosulfonic acid ester compound of the component (B) has an average esterification degree of 20% to 100%.

16. The resin composition according to claim 1, further comprising a low molecular weight phenol compound as a dissolution accelerator.

17. A process for preparation of a photoresist pattern, comprising coating said composition as defined in claim 1 on a substrate to form a coating film, prebaking the thus formed coating film to form a photoresist film, optionally post-baking the photoresist film, and exposing the photoresist film thus formed to radiation, whereby said photoresist pattern is formed.

18. A photoresist pattern obtained by the process as defined in claim 17.

19. The resin composition according to claim 16, wherein the dissolution accelerator is at least one member selected from the group consisting of the compounds represented by the following formulas (2-1) to (2-9):

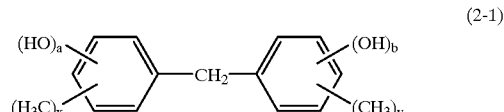
(2-1)

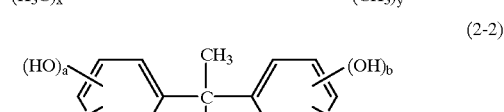
(2-2)

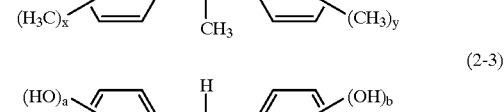
(2-3)

wherein in the formulas (2-1) to (2-3), a and b are each independently an integer of 0 to 3, provided that they are not 0 at the same time; x and y are each independently an integer of 0 to 3; and $a+x \leq 5$ and $b+y \leq 5$,

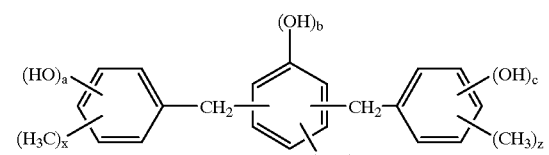
(2-4)

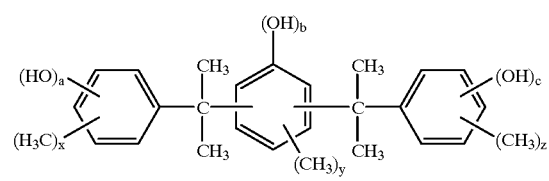
(2-5)

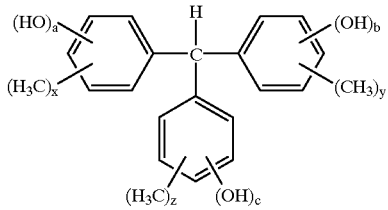
(2-6)

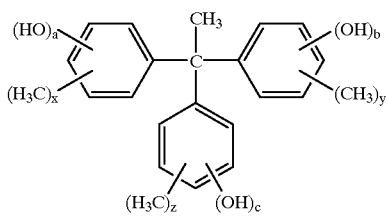
(2-7)

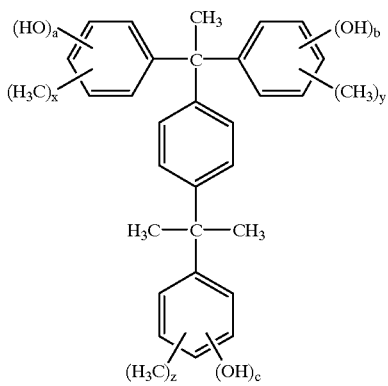
(2-8)

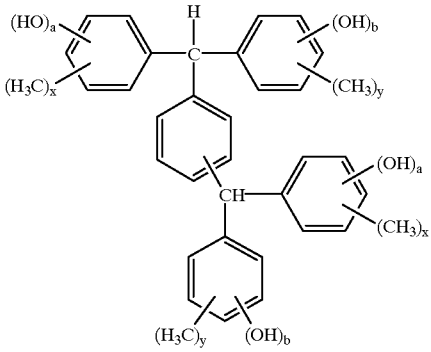
(2-9)

wherein in the formulas (2-4) to (2-9), a, b and c are each independently an integer of 0 to 3, provided that they are not 0 at the same time; x, y and z are each independently an integer of 0 to 3; in the formulas (2-4) and (2-5), $b+y \leqq 4$; in the formulas (2-6) to (2-9), $a+x \leqq 5$, $b+y \leqq 4$ and $c+z \leqq 5$.

20. The resin composition according to claim 1, wherein the compound having the formula (P-4) is the compound having the formula (6):

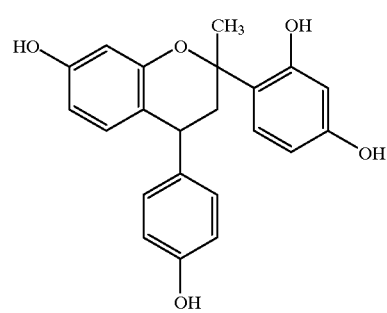
(6)

21. The resin composition according to claim 10, wherein the amount is 0.6 to 1.5 mols per mol of the total phenol compounds.

* * * * *